(12) United States Patent
Kaim et al.

(10) Patent No.: US 9,142,387 B2
(45) Date of Patent: Sep. 22, 2015

(54) ISOTOPICALLY-ENRICHED BORON-CONTAINING COMPOUNDS, AND METHODS OF MAKING AND USING SAME

(71) Applicant: Entegris, Inc., Billerica, MA (US)

(72) Inventors: Robert Kaim, Brookline, MA (US); Joseph D. Sweeney, New Milford, CT (US); Oleg Byl, Southbury, CT (US); Sharad N. Yedave, Danbury, CT (US); Edward E. Jones, Woodbury, CT (US); Peng Zou, Ridgefield, CT (US); Ying Tang, Brookfield, CT (US); Barry Lewis Chambers, Midlothian, VA (US); Richard S. Ray, New Milford, CT (US)

(73) Assignee: ENTEGRIS, INC., Billerica, MA (US)

( * ) Notice: Subject to any disclaimer, the term of this patent is extended or adjusted under 35 U.S.C. 154(b) by 59 days.

(21) Appl. No.: 14/095,575

(22) Filed: Dec. 3, 2013

(65) Prior Publication Data

US 2014/0090598 A1 Apr. 3, 2014

Related U.S. Application Data

(60) Division of application No. 13/300,575, filed on Nov. 19, 2011, now Pat. No. 8,598,022, which is a continuation-in-part of application No. 13/048,367, filed on Mar. 15, 2011, now Pat. No. 8,062,965, which (Continued)

(51) Int. Cl.
*C23C 16/00* (2006.01)
*H01J 37/317* (2006.01)
(Continued)

(52) U.S. Cl.
CPC ............. *H01J 37/3171* (2013.01); *C01B 35/00* (2013.01); *C01B 35/061* (2013.01); *C01P 2006/88* (2013.01); *H01J 2237/006* (2013.01); *H01J 2237/08* (2013.01)

(58) Field of Classification Search
CPC ..... C01B 35/00; C01B 35/061; H01J 37/3171; H01J 2237/08; H01J 2237/006; H01J 37/08; H01J 2237/31701; C01P 2006/88; C30B 25/02; C30B 29/02; C30B 29/36; H01L 21/265; H01L 21/28562
USPC ......................................................... 118/715
See application file for complete search history.

(56) References Cited

U.S. PATENT DOCUMENTS 3,472,751 A 10/1969 King
3,893,769 A 7/1975 Woolley
(Continued)

FOREIGN PATENT DOCUMENTS

CN 1484288 A 3/2004
CN 101384747 A 3/2009
(Continued)

OTHER PUBLICATIONS

Wilson, R., et al., "Comparison of Sources of Boron, Phosphorus, and Arsenic Ions", "Appl. Phys. Lett", Feb. 15, 1973, pp. 176-179, vol. 22, No. 4.

(Continued)

*Primary Examiner* — Michelle Mandala
(74) *Attorney, Agent, or Firm* — Hultquist, PLLC; Steven J. Hultquist; Rosa Yaghmour

(57) ABSTRACT

An isotopically-enriched, boron-containing compound comprising two or more boron atoms and at least one fluorine atom, wherein at least one of the boron atoms contains a desired isotope of boron in a concentration or ratio greater than a natural abundance concentration or ratio thereof. The compound may have a chemical formula of $B_2F_4$. Synthesis methods for such compounds, and ion implantation methods using such compounds, are described, as well as storage and dispensing vessels in which the isotopically-enriched, boron-containing compound is advantageously contained for subsequent dispensing use.

11 Claims, 1 Drawing Sheet

Related U.S. Application Data is a continuation-in-part of application No. 12/913,721, filed on Oct. 27, 2010, now Pat. No. 8,138,071.

(60) Provisional application No. 61/378,353, filed on Aug. 30, 2010, provisional application No. 61/375,031, filed on Aug. 18, 2010, provisional application No. 61/358,514, filed on Jun. 25, 2010, provisional application No. 61/349,202, filed on May 27, 2010, provisional application No. 61/255,097, filed on Oct. 27, 2009.

(51) Int. Cl.
*C01B 35/00* (2006.01)
*C01B 35/06* (2006.01)

(56) References Cited

U.S. PATENT DOCUMENTS

| | | |
|---|---|---|
| 3,960,605 A | 6/1976 | Beck et al. |
| 4,331,647 A | 5/1982 | Goldenberg |
| 4,348,376 A | 9/1982 | Goldenberg |
| 4,657,774 A | 4/1987 | Satou et al. |
| 4,680,358 A | 7/1987 | Yu |
| 4,722,978 A | 2/1988 | Yu |
| 4,803,292 A | 2/1989 | Ohfune et al. |
| 4,814,842 A | 3/1989 | Nakagawa et al. |
| 4,851,255 A | 7/1989 | Lagendijk et al. |
| 4,942,246 A | 7/1990 | Tanaka et al. |
| 5,061,322 A | 10/1991 | Asano |
| 5,443,732 A | 8/1995 | Lahoda et al. |
| 5,517,077 A | 5/1996 | Bright et al. |
| 5,518,528 A | 5/1996 | Tom et al. |
| 5,704,965 A | 1/1998 | Tom et al. |
| 5,704,967 A | 1/1998 | Tom et al. |
| 5,707,424 A | 1/1998 | Tom et al. |
| 5,761,910 A | 6/1998 | Tom et al. |
| 5,837,027 A | 11/1998 | Olander et al. |
| 5,851,270 A | 12/1998 | Olander |
| 5,891,242 A | 4/1999 | Pesklak et al. |
| 5,916,245 A | 6/1999 | Tom |
| 5,935,283 A | 8/1999 | Sweeney et al. |
| 5,935,293 A | 8/1999 | Detering et al. |
| 5,935,305 A | 8/1999 | Tom et al. |
| 5,977,552 A | 11/1999 | Foad |
| 5,993,766 A | 11/1999 | Tom et al. |
| 6,083,298 A | 7/2000 | Wang et al. |
| 6,086,837 A | 7/2000 | Cowan et al. |
| 6,089,027 A | 7/2000 | Wang et al. |
| 6,096,467 A | 8/2000 | Shimizu et al. |
| 6,101,816 A | 8/2000 | Wang et al. |
| 6,132,492 A | 10/2000 | Hultquist et al. |
| 6,135,128 A | 10/2000 | Graf et al. |
| 6,140,656 A | 10/2000 | Fujii |
| 6,204,180 B1 | 3/2001 | Tom et al. |
| 6,343,476 B1 | 2/2002 | Wang et al. |
| 6,376,664 B1 | 4/2002 | Chan et al. |
| 6,406,519 B1 | 6/2002 | Tom et al. |
| 6,420,304 B1 | 7/2002 | Tsai et al. |
| 6,452,338 B1 | 9/2002 | Horsky |
| 6,486,227 B2 | 11/2002 | Nohr et al. |
| 6,592,653 B2 | 7/2003 | Wang et al. |
| 6,600,092 B2 | 7/2003 | Lee |
| 6,660,063 B2 | 12/2003 | Tom et al. |
| 6,730,568 B2 | 5/2004 | Sohn |
| 6,734,446 B1 | 5/2004 | Yamazaki et al. |
| 6,740,586 B1 | 5/2004 | Wang et al. |
| 6,743,278 B1 | 6/2004 | Carruthers |
| 6,780,896 B2 | 8/2004 | MacDonald et al. |
| 6,802,294 B2 | 10/2004 | Osman |
| 6,852,610 B2 | 2/2005 | Noda |
| 6,868,869 B2 | 3/2005 | Olander |
| 6,872,639 B2 | 3/2005 | DeBoer et al. |
| 6,885,057 B2 | 4/2005 | Osada et al. |
| 6,893,907 B2 | 5/2005 | Maydan et al. |
| 6,905,947 B2 | 6/2005 | Goldberg |
| 6,909,839 B2 | 6/2005 | Wang et al. |
| 6,921,062 B2 | 7/2005 | Gregg et al. |
| 6,939,769 B2 | 9/2005 | Oh |
| 6,998,626 B1 | 2/2006 | Ryding et al. |
| 7,094,670 B2 | 8/2006 | Collins et al. |
| 7,138,768 B2 | 11/2006 | Maciejowski et al. |
| 7,144,809 B2 | 12/2006 | Elers et al. |
| 7,300,038 B2 | 11/2007 | Gregg et al. |
| 7,397,048 B2 | 7/2008 | Singh et al. |
| 7,473,606 B2 | 1/2009 | Hsiao et al. |
| 7,518,124 B2 | 4/2009 | Goldberg |
| 7,641,879 B2 | 1/2010 | Spielvogel et al. |
| 7,666,770 B2 | 2/2010 | Sasaki et al. |
| 7,759,657 B2 | 7/2010 | Tieger et al. |
| 7,825,016 B2 | 11/2010 | Giles |
| 7,833,886 B2 | 11/2010 | Giles et al. |
| 7,919,402 B2 | 4/2011 | Jacobson et al. |
| 7,947,582 B2 | 5/2011 | Hautala et al. |
| 8,013,312 B2 | 9/2011 | Adams |
| 8,062,965 B2 | 11/2011 | Kaim et al. |
| 8,076,694 B2 | 12/2011 | Narukawa et al. |
| 8,187,971 B2 | 5/2012 | Russell et al. |
| 8,237,136 B2 | 8/2012 | Hautala et al. |
| 8,252,651 B2 | 8/2012 | Kawasaki |
| 8,389,068 B2 | 3/2013 | Olander et al. |
| 2002/0014407 A1 | 2/2002 | Allen et al. |
| 2002/0130278 A1 | 9/2002 | Vella |
| 2003/0003668 A1 | 1/2003 | Oh |
| 2003/0023118 A1 | 1/2003 | Kanayama et al. |
| 2003/0203608 A1 | 10/2003 | Deboer et al. |
| 2003/0216014 A1 | 11/2003 | Goldberg |
| 2004/0002202 A1 | 1/2004 | Horsky et al. |
| 2004/0053457 A1 | 3/2004 | Sohn |
| 2004/0110351 A1 | 6/2004 | Narasimha |
| 2004/0119025 A1 | 6/2004 | Klepper et al. |
| 2004/0166612 A1 | 8/2004 | Maydan et al. |
| 2004/0235280 A1 | 11/2004 | Keys et al. |
| 2005/0035284 A1 | 2/2005 | Schultz et al. |
| 2005/0051096 A1 | 3/2005 | Horsky et al. |
| 2005/0163693 A1 | 7/2005 | Spielvogel et al. |
| 2005/0169827 A1 | 8/2005 | Spielvogel et al. |
| 2005/0176832 A1 | 8/2005 | Tonkovich et al. |
| 2005/0191816 A1 | 9/2005 | Vanderpool et al. |
| 2005/0202657 A1 | 9/2005 | Borland et al. |
| 2006/0097193 A1 | 5/2006 | Horsky et al. |
| 2006/0102464 A1 | 5/2006 | Tillotson |
| 2006/0104851 A1 | 5/2006 | Tillotson |
| 2006/0264051 A1 | 11/2006 | Thibaut |
| 2007/0059848 A1 | 3/2007 | Sasaki et al. |
| 2007/0148888 A1 | 6/2007 | Krull et al. |
| 2007/0178679 A1 | 8/2007 | Hatem et al. |
| 2008/0138967 A1 | 6/2008 | Li et al. |
| 2008/0138968 A1 | 6/2008 | Porshnev et al. |
| 2008/0149929 A1 | 6/2008 | Giles |
| 2008/0248636 A1 | 10/2008 | Olander et al. |
| 2008/0305598 A1 | 12/2008 | Horsky et al. |
| 2009/0087578 A1* | 4/2009 | Hautala ..................... 427/526 |
| 2009/0294698 A1 | 12/2009 | Ray |
| 2010/0112795 A1 | 5/2010 | Kaim et al. |
| 2010/0224264 A1 | 9/2010 | Homan et al. |
| 2010/0266087 A1 | 10/2010 | Ahlfeld et al. |
| 2011/0065268 A1 | 3/2011 | Olander et al. |
| 2011/0079241 A1 | 4/2011 | Sinha et al. |
| 2011/0097882 A1 | 4/2011 | Kaim et al. |
| 2011/0143527 A1 | 6/2011 | Platow et al. |
| 2011/0159671 A1 | 6/2011 | Kaim et al. |
| 2011/0165053 A1 | 7/2011 | Cook et al. |
| 2012/0051994 A1 | 3/2012 | Byl et al. |
| 2012/0108044 A1 | 5/2012 | Kaim et al. |
| 2012/0119113 A1 | 5/2012 | Colvin et al. |
| 2012/0252195 A1 | 10/2012 | Jones et al. |
| 2013/0137250 A1 | 5/2013 | Olander et al. |

FOREIGN PATENT DOCUMENTS

| | | |
|---|---|---|
| EP | 0079705 A1 | 5/1983 |
| EP | 0385709 B1 | 5/1995 |
| EP | 0656668 B1 | 3/1999 |

(56) References Cited

FOREIGN PATENT DOCUMENTS

| | | |
|---|---|---|
| JP | 58-8071 A | 1/1983 |
| JP | 62095820 A | 5/1987 |
| JP | 63-15228 A | 1/1988 |
| JP | 6438700 A | 2/1989 |
| JP | 64-83147 A | 3/1989 |
| JP | 1-225117 A | 9/1989 |
| JP | 3165443 A | 7/1991 |
| JP | 5106038 A | 4/1993 |
| JP | 5-254808 A | 10/1993 |
| JP | 6-80681 A | 3/1994 |
| JP | 6-204160 A | 7/1994 |
| JP | 6-204516 A | 7/1994 |
| JP | 7065761 A | 3/1995 |
| JP | 7-90201 A | 4/1995 |
| JP | 7299304 A | 11/1995 |
| JP | 8288233 A | 11/1996 |
| JP | 9-298166 A | 11/1997 |
| JP | 10-251592 A | 9/1998 |
| JP | 11-329266 A | 11/1999 |
| JP | 2001-332509 A | 11/2001 |
| JP | 2002-343882 A | 11/2002 |
| JP | 2002-348381 A | 12/2002 |
| JP | 2006-196465 A | 7/2006 |
| JP | 2008-518482 A | 5/2008 |
| JP | 2009-506580 A | 2/2009 |
| JP | 2011-502923 A | 1/2011 |
| KR | 1020060070456 A | 6/2006 |
| TW | 200832523 A | 8/2008 |
| WO | 9811764 A1 | 3/1998 |
| WO | 0143157 A1 | 6/2001 |
| WO | 03057667 A2 | 7/2003 |
| WO | 03100806 A1 | 12/2003 |
| WO | 2004003973 A2 | 1/2004 |
| WO | 2004003990 A1 | 1/2004 |
| WO | 2004053945 A2 | 6/2004 |
| WO | 2005020306 A1 | 3/2005 |
| WO | 2005027208 A1 | 3/2005 |
| WO | 2005059942 A2 | 6/2005 |
| WO | 2006047373 A2 | 5/2006 |
| WO | 2006095086 A2 | 9/2006 |
| WO | 2007027798 A2 | 3/2007 |
| WO | 2007056249 A1 | 5/2007 |
| WO | 2007087212 A1 | 8/2007 |
| WO | 2007134183 A2 | 11/2007 |
| WO | 2008121549 A1 | 10/2008 |

OTHER PUBLICATIONS

Becher, H., et al., "Vibrational Spectra of Normal, Boron-10-Enriched, and Deuteriomethylboron Difuoride", "Spectrochimica Acta Part A: Molecular Spectroscopy", 1978, pp. 141-146 (English Abstract), vol. 34, No. 2.

Byl, O., et al., "Properties of Diboron Tetrafluoride (B2F4), A New Gas for Boron Ion Implantation", "AIP Conf. Proc., 18th International Conference on Ion Implantation Technology", Jun. 6-11, 2010, pp. 408-410, vol. CP1321, Published in: Kyoto, Japan.

Collart, E., et al., "Low energy boron implantation in silicon and room temperature diusion", "Nuclear Instruments and Methods in Physics Research B", 1998, pp. 98-107, vol. 139.

Kirk, R., "Dissertation on Synthetic Chemistry of Several High Temperature Boron Containing Species", 1969, pp. 1-118.

Kirk, R., et al., "Boron-Fluorine Chemistry. 111. Silicon-Boron Fluorides", "Journal of the American Chemical Society", Nov. 5, 1969, pp. 6315-6318, vol. 91, No. 23.

Koivisto, H., et al., "The first results with the new JYFL 14 GHz ECR ion source", "Nuclear Instruments and Methods in Physics Research B", 2001, pp. 379-384, vol. 174.

Kondratenko, S., et al., "Surface Oxidation Effects During Low Energy BF2positive Ion Implantation", "AIP Conf. Proc., 18th International Conference on Ion Implantation Technology", Jun. 6-11, 2010, pp. 127-130, vol. CP1321, Published in: Kyoto, Japan.

Kwok, D., et al., "Energy distribution and depth profile in BF3 plasma doping", "Surface and Coatings Technology", 2001, pp. 146-150, vol. 136.

Lu, N., et al., "Transition metal complexes incorporating the BF2 ligand formed by oxidative addition of the B-B bond in B2F4", "J. Chem. Soc., Dalton Trans.", Oct. 26, 2000, pp. 4032-4037.

Tang, Y., et al., "Improvements in Bpositive and BF2positive Beam Currents Through the Use of Diboron Tetrafluoride (B2F4) Gas", "AIP Conf. Proc., 18th International Conference on Ion Implantation Technology", Jun. 6-11, 2010, pp. 167-170, vol. CP1321, Published in: Kyoto, Japan.

Timms, P., "Boron-Fluorine Chemisty. I. Boron Monofluoride and Some Derivatives", "Journal of the American Chemical Society", Mar. 29, 1967, vol. 89, No. 7.

Weast, R. (Ed.), "Physical Constants of Inorganic Compounds—Boric Acid", "Handbook of Chemistry and Physics, 56th Edition", Sep. 1975, pp. B-78, Publisher: CRC Press, Inc.

Weast, R. (Ed.), "Vapor Pressure Inorganic Compounds ", "Handbook of Chemistry and Physics, 56 Ed.", Sep. 1975, pp. D-183-D-188, Publisher: CRC Press, Inc.

"Webster's Ninth New Collegiate Dictionary", 1990, p. 578 Publisher: Merriam-Webster Inc., Published in: Springfield, Massachusetts, US.

Yu, J., et al., "Isotopically Enriched 10BN Nanotubes", "Advanced Materials", Jul. 2006, pp. 2157-2160, vol. 18.

Lu, Z., et al., "Shallow Junction Formation With Boron Fluoride and Low Energy Boron Ion Implantation Into Silicon", "Nuclear Instruments and Methods in Physics Research B", 1989, pp. 46-49, vol. 43.

Ziegler, J. (Ed.), "Chapter 2: Advanced Technologies and Applications of Ion Implantation", "Ion Implantation Science and Technology", 2004, pp. 2-1-2-16, Publisher: Ion Implantation Technology Co., Published in: Edgewater, MD, US.

Note: For the non-patent literature citations that no month of publications is indicated, the year of publication is more than 1 year prior to the effective filing date of the present application.

Hayton, L., et al., "An ESR study of the reaction of silver atoms with B2F4 under matrix isolation conditions", "J. Chem. Soc., Dalton Trans.", Mar. 8, 2002, pp. 1327-1329.

\* cited by examiner

ISOTOPICALLY-ENRICHED BORON-CONTAINING COMPOUNDS, AND METHODS OF MAKING AND USING SAME

CROSS-REFERENCE TO RELATED APPLICATIONS

This is a divisional application under 35 USC 120 of U.S. patent application Ser. No. 13/300,575 filed Nov. 19, 2011 in the names of Robert Kaim, et al. for "ISOTOPICALLY-ENRICHED BORON-CONTAINING COMPOUNDS, AND METHODS OF MAKING AND USING SAME," and issued Dec. 3, 2013 as U.S. Pat. No. 8,598,022, which is a continuation in part under 35 USC 120 of U.S. patent application Ser. No. 13/048,367 filed Mar. 15, 2011 in the names of Robert Kaim, et al. for "ISOTOPICALLY-ENRICHED BORON-CONTAINING COMPOUNDS, AND METHODS OF MAKING AND USING SAME," and issued Nov. 22, 2011 as U.S. Pat. No. 8,062,965, which is a continuation in part under 35 USC 120 of U.S. patent application Ser. No. 12/913,721 filed Oct. 27, 2010 in the names of Robert Kaim, et al. for "ISOTOPICALLY-ENRICHED BORON-CONTAINING COMPOUNDS, AND METHODS OF MAKING AND USING SAME," and issued Mar. 20, 2012 as U.S. Pat. No. 8,138,071, which in turn claims the benefit of priority under 35 USC 119(e) of the following U.S. Provisional Patent Applications: U.S. Provisional Patent Application No. 61/378,353 filed Aug. 30, 2010 in the names of Oleg Byl, et al. for "ISOTOPICALLY-ENRICHED BORON-CONTAINING COMPOUNDS, AND METHODS OF MAKING AND USING SAME;" U.S. Provisional Patent Application No. 61/375,031 filed Aug. 18, 2010 in the names of Oleg Byl, et. al. for "ISOTOPICALLY-ENRICHED BORON-CONTAINING COMPOUNDS, AND METHODS OF MAKING AND USING SAME;" U.S. Provisional Patent Application No. 61/358,514 filed Jun. 25, 2010 in the names of Edward Jones, et al. for "ACTIVE COOLING FOR ION IMPLANT GAS DELIVERY SYSTEM;" U.S. Provisional Patent Application No. 61/349,202 filed May 27, 2010 in the names of Edward Jones, et al. for "ACTIVE COOLING FOR ION IMPLANT GAS DELIVERY SYSTEM;" and U.S. Provisional Patent Application No. 61/255,097 filed Oct. 27, 2009 in the names of Robert Kaim, et al. for "BORON ION IMPLANTATION APPARATUS AND METHOD." The disclosures of all of said U.S. patent application Ser. Nos. 13/300,575; 13/048,367; and 12/913,721 and U.S. Provisional Patent Application Nos. 61/378,353; 61/375,031; 61/358,514; 61/349,202; and 61/255,097 are hereby incorporated herein by reference, in their respective entireties, for all purposes.

FIELD

The present disclosure relates to isotopically-enriched boron-containing compounds, compositions, and methods of making and using same.

DESCRIPTION OF THE RELATED ART

Ion implantation is used in integrated circuit fabrication to accurately introduce controlled amounts of dopant impurities into semiconductor wafers and is a crucial process in microelectronic/semiconductor manufacturing.

In such implantation systems, an ion source ionizes a desired dopant element of a dopant source gas. The ion source generates ions by introducing electrons into a vacuum chamber filled with the dopant source gas (also commonly referred to as the "feedstock gas"). Feedstock gases used to generate implant species include, but are not limited to, $BF_3$, $B_{10}H_{14}$, $B_{12}H_{22}$, $PH_3$, $AsH_3$, $PF_5$, $AsF_5$, $H_2Se$, $N_2$, $Ar$, $GeF_4$, $SiF_4$, $O_2$, $H_2$, and $GeH_4$. The compositions containing the dopant element to be implanted are typically referred to as dopant sources or precursors. Collisions of the electrons with dopant atoms and molecules in the gas results in the creation of an ionized plasma consisting of positive and negative dopant ions.

The resulting ions are extracted from the source in the form of an ion beam of desired energy. Extraction is achieved by applying a high voltage across suitably shaped extraction electrodes, which incorporate apertures for passage of the extracted beam. The extracted beam passes through the aperture and out of the ion source as a collimated ion beam, which is accelerated towards the substrate.

The ion beam is impinged on the surface of the substrate, such as a semiconductor wafer, in order to implant the substrate with the dopant element. The ions of the beam penetrate the surface of the substrate to form a region of desired conductivity. Implanted ion species variously include B, P, As, Se, N, Ar, Ge, Si, O, and H, with boron being a particularly widely used implant species.

One of the main steps in manufacturing of integrated circuits is implantation of boron into silicon wafers. Since elemental boron exhibits very low vapor pressure even at high temperatures, utilization of volatile boron-containing compounds is necessary. Currently, boron trifluoride ($BF_3$) is widely used as a feed gas for boron implantation (for example, it is estimated that the 2007 annual worldwide consumption of $BF_3$ for ion implantation was ~3000 kg).

Despite its widespread use, $BF_3$ does have disadvantages. The $BF_3$ molecule is very difficult to ionize and only about 15% of all $BF_3$ flowed into the ion source can be fragmented. The rest is discarded. Further, only about 30% of the ionized $BF_3$ is converted into $B^+$ ions that can be used for implantation. This results in low $B^+$ beam current that severely limits implantation process throughput.

Some increase of $B^+$ beam current can be achieved by varying the process parameters, such as by raising the extraction current, and by increasing the $BF_3$ flow rate. These measures result in reduced life time of the ion source, high voltage arcing leading to tool instability, and poor vacuum causing beam energy contamination. Even without drastic adjustment of the implantation process parameters, it is well established that implantation of boron requires more frequent preventive maintenance interruptions that present other problems for integrated circuit manufacturers.

The problem of throughput limitation because of low $B^+$ beam current has become more important in recent years due to the semiconductor industry's general trend toward utilization of lower implantation energies. At lower implantation energies, the $B^+$ beam experiences a greater blow-out effect due to space charge and the low atomic weight of boron.

In addition to the foregoing problems, it has been mentioned that elemental boron has a very low vapor pressure. Accordingly, if a boron-containing precursor is susceptible to excessive decomposition resulting in deposition of boron residue, then it may be unsuitable for ion implantation, from an ion implanter tool operation perspective.

In consequence of the foregoing, the art continues to seek improved boron precursors.

SUMMARY

The present disclosure relates to isotopically-enriched boron-containing compounds, and methods of making and using same.

In one aspect, the disclosure relates to an isotopically-enriched, boron-containing compound comprising two or more boron atoms and at least one fluorine atom, wherein at least one of the boron atoms contains a desired isotope of boron in a concentration or ratio greater than a natural abundance concentration or ratio thereof.

A further aspect of the disclosure relates to a method of implanting boron into a substrate, comprising ionizing the compound of an above-describe type, to generate boron ions; and implanting the boron ions into a substrate.

Yet another aspect of the disclosure relates to a beam-line ion implantation, plasma immersion ion implantation or plasma doping system, comprising a source of the compound described above.

Another aspect of the disclosure relates to a gas storage and dispensing vessel comprising a compound of a above-described type.

The disclosure in another aspect relates to a method of improving beam current for an ion implantation process, comprising: flowing the compound of a type as described above; and generating an ion beam from the compound.

A further aspect of the disclosure relates to a method of synthesizing the compound of a type as described above, comprising contacting a boron-containing gas with a boron metal.

The disclosure relates another aspect to a method of preparing a source of the compound of an above described type, comprising filling a storage and dispensing vessel with the compound.

Another aspect of the disclosure relates to an ion implantation method, comprising flowing a compound of the type described above to an ion implantation tool with at least one co-flowed species selected from the group consisting of inert gas, argon, nitrogen, helium, hydrogen, ammonia, xenon, xenon difluoride, isotopically enriched diborane, and natural abundance diborane.

A further aspect of the disclosure relates to an ion implantation method, comprising flowing an isotopically-enriched atomic mass 11 boron $B_2F_4$ compound to an ion implantation tool with an isotopically-enriched atomic mass 11 boron $BF_3$ compound.

Yet another aspect of the disclosure relates to an ion implantation method comprising use of a compound of an above-described type in an ion implantation tool, and periodically cleaning said tool or a component thereof by flow therethrough of a cleaning agent that is effective to at least partially remove deposits formed in said tool or a component thereof by ion implantation operation.

A further aspect of the disclosure relates to a method of carrying out ion implantation, comprising using a compound of a type as described above in an ion implantation tool as the only dopant source compound used in operation of said ion implantation tool.

Another aspect of the disclosure relates to a method of carrying out ion implantation, comprising conducting said ion implantation in an ion implantation tool processing only isotopically enriched atomic mass 11 boron $B_2F_4$ as a dopant compound therein.

In another aspect, the disclosure relates to a method of carrying out ion implantation, comprising conducting said ion implantation in an ion implantation tool using isotopically enriched atomic mass 11 boron $B_2F_4$ as a dopant compound therein, wherein the ion implantation tool also processes at least one of arsine, phosphine, carbon dioxide, carbon monoxide, silicon tetrafluoride and boron trifluoride.

A further aspect of the disclosure relates to a storage and dispensing vessel containing a compound of an above-described type in a storage medium selected from the group consisting of physical adsorbents and ionic liquids.

Yet another aspect of the disclosure relates to a storage and dispensing vessel containing a compound of an above-described type, wherein the vessel contains a restricted flow orifice located either within the vessel or within an output port of the vessel.

A further aspect the disclosure relates to a storage and dispensing vessel containing a compound of an above-described type, wherein the vessel is pressure-regulated for dispensing of the compound at subatmospheric pressure.

The disclosure relates in another aspect to an ionized composition useful for AMU separation to generate ionic species for ion implantation, said composition deriving from a boron precursor compound other than $BF_3$, wherein said boron precursor compound is isotopically enriched beyond natural abundance in one of $^{10}B$ and $^{11}B$, and wherein said composition comprises one or more species from among $B_2F_4^+$, $B_2F_3^+$, $B_2F_2^+$, $BF_3^+$, $BF_2^+$, $BF^+$, $B^+$, $F^+$, $B_2F_4^{++}$, $B_2F_3^{++}$, $B_2F_2^{++}$, $BF_3^{++}$, $BF_2^{++}$, $BF^{++}$, $B^{++}$, $F^{++}$, $B_2F_4^{+++}$, $B_2F_3^{+++}$, $B_2F_2^{+++}$, $BF_3^{+++}$, $BF_2^{+++}$, $BF^{+++}$, $B^{+++}$, and $F^{+++}$, the boron-containing ones of which are isotopically enriched beyond natural abundance in one of $^{10}B$ and $^{11}B$.

A further aspect of the disclosure relates to a boron ionic species selected from among $B_2F_4^+$, $B_2F_3^+$, $B_2F_2^+$, $BF_3^+$, $BF_2^+$, $BF^+$, $B^+$, $B_2F_4^{++}$, $B_2F_3^{++}$, $B_2F_2^{++}$, $BF_3^{++}$, $BF_2^{++}$, $BF^{++}$, $B^{++}$, $B_2F_4^{+++}$, $B_2F_3^{+++}$, $B_2F_2^{+++}$, $BF_3^{+++}$, $BF_2^{+++}$, $BF^{+++}$ and $B^{+++}$, and isotopically enriched beyond natural abundance in one of $^{10}B$ and $^{11}B$.

The disclosure in another aspect relates to a method of improving beam current for an ion implantation process, comprising use of an isotopically-enriched, boron-containing compound that is effective to form isotopically enriched ionic species producing such improved beam current, in relation to a corresponding non-isotopically-enriched, boron-containing compound.

A further aspect the disclosure relates to a process system, comprising:

a process tool;

a first boron precursor source configured to supply a first boron precursor to the process tool; and a second boron precursor source configured to supply a second boron precursor to the process tool concurrently with the first boron precursor, wherein the first boron precursor source comprises $B_2F_4$ and the second boron precursor source comprises diborane.

A still further aspect the disclosure relates to an ion implantation process, comprising:

co-flowing $B_2F_4$ and diborane to an ionizing zone;

ionizing the co-flowed $B_2F_4$ and diborane in the ionizing zone to form boron dopant species; and ion implanting the boron dopant species.

Other aspects, features and embodiments of the invention will be more fully apparent from the ensuing disclosure and appended claims.

DETAILED DESCRIPTION

Figure 1:
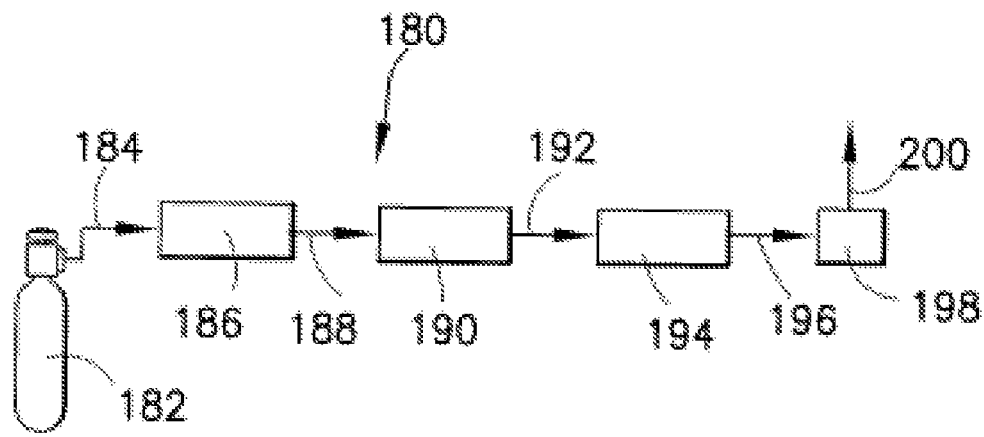
FIG. 1 is a schematic illustration of a semiconductor manufacturing facility including an ion implantation system arranged to receive an isotopically-enriched boron-containing precursor from a precursor supply vessel, according to one embodiment of the present disclosure.

The present disclosure relates to isotopically-enriched boron-containing compounds, compositions, and to methods of making and using same.

In one aspect, the disclosure relates to an isotopically-enriched, boron-containing compound comprising two or more boron atoms and at least one fluorine atom, wherein at least one of the boron atoms contains a desired isotope of boron in a concentration or ratio that is greater than a natural abundance concentration or ratio thereof (of the desired isotope).

The boron-containing compound can be of any suitable type, and can include any number of boron atoms. In one embodiment, the boron-containing compound contains at least two boron atoms and at least one fluorine atom. In another embodiment, the boron-containing compound contains from 2 to 80 boron atoms, including diboron compounds such as $B_2F_4$, $B_2H_6$, $H_2B_2F_6$, $H_2B_2F_2O_3$, $H_2B_2F_2O_6$, and $H_2B_2F_4O_2$, triboron compounds such as $B_3F_6$, tetraboron compounds such as $H_4B_4F_{10}$, $B(BF_2)_3CO_3$ and $(F_2B)_3BCO$, pentaboron compounds, hexaboron compounds, septaboron compounds, octaboron compounds such as $B_8F_{12}$, nonaborane compounds, decaboron compounds such as $B_{10}F_{12}$, undecaboron compounds, dodecaboron compounds, etc., up to $B_{80}$ compounds such as $B_{80}$ analogs of fullerenes. In other embodiments, the boron-containing compound can contain 2, 3, 4, 5, 6, 7, 8, 9, 10, or 11 boron atoms. Additional embodiments may comprise cluster boron compounds. In still other embodiments, the boron-containing compound can be a diboron compound. In other embodiments, the boron-containing compound can comprise diboron compounds other than particular boron-containing compound species, e.g., diboron compounds other than diborane. It will therefore be appreciated that the disclosure contemplates a wide variety of classes of boron-containing compounds, within the broad scope thereof.

In one embodiment of the isotopically-enriched, boron-containing compound, the desired isotope is atomic mass 10 boron and the natural abundance concentration is about 19.9%. In such boron compound, the concentration of atomic mass 10 boron isotope can for example be greater than 19.9%, 20%, 25%, 30%, 35%, 40%, 45%, 50%, 55%, 60%, 65%, 70%, 80%, 85%, 90%, 95%, 96%, 97%, 98%, 99%, 99.9%, or 99.99%, in specific compositional variants. For example, the concentration of atomic mass 10 boron isotope can be 20-25%, 25-30%, 30-35%, 35-40%, 40-45%, 45-50%, 50-55%, 55-60%, 60-65%, 65-70%, 70-75%, 75-80%, 80-85%, 85-90%, 90-95%, 95-99% or 95-99.9%. In other embodiments, the concentration of atomic mass 10 boron isotope can be 20-30%, 30-40%, 40-50%, 50-60%, 60-70%, 70-80%, 80-90%, or 90-99%. In various ones of these various embodiments, the boron-containing compound contains two boron atoms.

In another embodiment of the isotopically-enriched, boron-containing compound, the desired isotope is atomic mass 11 boron and the natural abundance concentration is about 80.1%. In such boron compound, the concentration of atomic mass 11 boron isotope can for example be greater than 80.1%, 85%, 90%, 95%, 96%, 97%, 98%, 99%, 99.9% or 99.99%, in specific compositional variants. For example, the concentration of atomic mass 11 boron isotope can be 81-85%, 85-90%, 90-95%, 95-99%, 95-99.9%. In a specific embodiment, the concentration of atomic mass 11 boron isotope can be 81-90% or 90-99%. In various ones of these various embodiments, the boron-containing compound contains two boron atoms and at least one fluorine atom, and in other compounds, the ratio of $^{11}B$ to $^{10}B$ is in a range of from 4.1 to 10,000.

In various embodiments of the isotopically-enriched boron-containing compounds as described above, the boron-containing compound has a chemical formula of $B_2F_4$. In various other embodiments of the isotopically-enriched boron-containing compounds as described above, the boron-containing compound has a chemical formula of $B_2F_6$.

More generally, in isotopically-enriched, boron-containing compounds of the present disclosure, the concentration of desired isotopes in the two or more boron atoms can be the same as, or different from, one another. In various embodiments of the isotopically-enriched boron-containing compounds of the present disclosure, the boron-containing compound contains 3, 4, 5, 6, 7, 8, 9, 10, or 11 boron atoms.

The present disclosure, in one aspect, relates to a method of implanting boron into a substrate, comprising ionizing an isotopically-enriched, boron-containing compound as variously described herein, to generate boron ions, and implanting the boron ions into a substrate. In such method, the isotopically-enriched, boron-containing compound may be of any suitable type described hereinabove. In one embodiment, the compound has a chemical formula of $B_2F_4$. In various other embodiments of such method, the isotopically-enriched, boron-containing compound has a chemical formula of $B_2F_6$.

The disclosure in another aspect relates to a beam-line ion implantation, plasma immersion ion implantation or plasma doping system, comprising a source of the isotopically-enriched, boron-containing compound, wherein the compound may be of any type as variously described hereinabove. In one embodiment, the compound has a chemical formula of $B_2F_4$. In various other embodiments of such method, the isotopically-enriched, boron-containing compound has a chemical formula of $B_2F_6$. In another embodiment, the disclosure relates to ion implantation, in which boron ions are generated and accelerated by an electric field for impingement on a substrate, such as a microelectronic device substrate. Such method of implanting boron-containing ions in one implementation includes ionizing a boron-containing dopant species at a high ionization efficiency of at least 15% using an arc voltage less than 100 volts, preferably less than 90 volts, more preferably less than 80 volts, and most preferably less than 70 volts, using a conventional hot cathode ion source or comparable voltages using another ion source. In other embodiments, the ion implantation specifically excludes plasma immersion processes.

The above-described beam-line ion implantation, plasma immersion ion implantation or plasma doping system, in specific implementations thereof, comprise a conduit adapted for delivery of the isotopically-enriched boron-containing compound to an ionization chamber, wherein the conduit is maintained at a temperature effective to minimize or otherwise suppress clogging of the conduit and/or decomposition of the compound in the conduit. For such purpose, the ionization chamber and/or the precursor feed conduit can be equipped with active cooling capability, such as by provision of heat exchange flow circuitry serving to reduce the temperature of the influent dopant gas entering the ionization chamber.

In the delivery of the isotopically-enriched, boron-containing compound to the ion implanter tool, the isotopically-enriched, boron-containing compound may be delivered, e.g., co-flowed to the ion implanter tool, with other component(s), such as inert gas species, e.g., argon, xenon, nitrogen, helium or the like, hydrogen, ammonia, other boron precursors such as natural abundance boron precursors, other isotopically-enriched boron-containing precursors, other dopant precursors (i.e., non-boron dopant precursors), or one or more of the foregoing components.

In one embodiment, the isotopically-enriched, boron-containing compound, e.g., enriched atomic mass 11 boron isotope-containing $B_2F_4$, is co-flowed to the ion implanter tool with an enriched atomic mass 11 boron isotope-containing $BF_3$, whereby the dilution of the isotopically-enriched $B_2F_4$ with the isotopically-enriched $BF_3$ serves to enhance the resistance of the precursor stream to clogging of feed lines to the tool. In such case, the beam current can be maintained at levels that provide a significant benefit operationally, while concurrently maximizing the service life of the ion source.

In various other implementations of the use of isotopically-enriched, boron-containing precursors, operation of the ion implantation system may be carried out with in-situ cleaning of components of the system, such as by flow of a cleaning agent into the system or specific components thereof to be cleaned, at periodic intervals. The cleaning agent utilized in such operation can be of any suitable type, such as for example xenon difluoride, fluorine, nitrogen trifluoride, or other agent that is effective in contact with deposits formed in the ion implantation system or specific components thereof to be cleaned, to at least partially remove such deposits. The location to be cleaned in the ion implantation system by such periodic introduction of cleaning agent can be the gas tube, the arc chamber, forelines, or any other locations or regions in the tool or ancillary equipment in which deposits can be formed by chemical species utilized in the ion implantation operation.

In another implementation of the use of isotopically-enriched, boron-containing compounds as precursors, an ion implantation tool is operated with isotopically-enriched atomic mass 11 boron $B_2F_4$ as the only dopant precursor. In yet another implementation, ion implantation is carried out with isotopically-enriched atomic mass 11 boron $B_2F_4$ as the dopant species on an ion implantation tool that also is used to carry out doping operation involving a dopant precursor selected from the group consisting of arsine, phosphine, carbon dioxide, carbon monoxide, silicon tetrafluoride, and boron trifluoride.

A further aspect of the disclosure relates to a gas storage and dispensing vessel comprising an isotopically-enriched, boron-containing compound of any type as variously described herein. Such gas storage and dispensing vessel may for example contain an isotopically-enriched, boron-containing compound having the chemical formula of $B_2F_4$. The gas storage and dispensing vessel in specific embodiments may comprise one or more of a regulator, check valve, adsorbent, filter, and capillary flow restriction device disposed in an interior volume of the vessel. The vessel in other embodiments may contain a storage medium for the boron-containing compound, such as a solid-phase physical adsorbent, or alternatively an ionic liquid storage medium. In still other embodiments, the vessel can include a restrictive flow orifice located either within an interior volume of the vessel or within a connection port, e.g., outlet port, of the vessel.

Another aspect of the invention relates to a method of synthesizing an isotopically-enriched, boron-containing compound of any suitable type as described herein above, comprising contacting a boron-containing gas with a boron metal. In such method, one or both of the boron-containing gas and boron metal can be isotopically enriched. Thus, for example, the disclosure contemplates a combination of isotopically enriched boron metal and natural abundance boron trifluoride as being contacted, in one embodiment. In another illustrative embodiment, the disclosure contemplates combination of natural abundance boron metal and isotopically enriched boron trifluoride as being the contacted species, and in yet another illustrative embodiment, the disclosure contemplates contacting of isotopically enriched boron metal and isotopically enriched boron trifluoride.

As a specific example of the synthesis method described above, the isotopically-enriched, boron-containing compound that is synthesized in the contacting may be $B_2F_4$ and the boron-containing gas may be boron trifluoride.

The foregoing synthesis method may be carried out using atomic mass 10 boron isotope in the boron metal at any suitable concentration. In specific embodiments, the concentration of atomic mass 10 boron isotope in the boron metal can be greater than 19.9%, 20%, 25%, 30%, 35%, 40%, 45%, 50%, 55%, 60%, 65%, 70%, 80%, 85%, 90%, 95%, 99%, 99.9%, or 99.99%.

In other embodiments, the synthesis method may be carried out using atomic mass 11 boron isotope in the boron metal, and in specific embodiments of such type, the concentration of atomic mass 11 boron isotope in the boron metal can be greater than 80.1%, 85%, 90%, 95%, 99%, 99.9% or 99.99%.

In still other embodiments of the synthesis method, in which boron trifluoride is employed, isotopically enriched boron trifluoride species can be employed, such as boron trifluoride in which the concentration of atomic mass 10 boron isotope is greater than 19.9%, 20%, 25%, 30%, 35%, 40%, 45%, 50%, 55%, 60%, 65%, 70%, 80%, 85%, 90%, 95%, 99%, 99.9%, or 99.99%.

In other embodiments, the synthesis method using boron trifluoride in isotopically enriched form can be carried out, in which the boron trifluoride is enriched in atomic mass 11 boron isotope, wherein the concentration of atomic mass 11 boron isotope in the boron trifluoride is greater than 80.1%, 85%, 90%, 95%, 99%, 99.9% or 99.99%.

The disclosure in a further aspect relates to a method of improving beam current for an ion implantation process, comprising use of an isotopically-enriched, boron-containing compound that is effective to produce such improved beam current, in relation to a corresponding non-isotopically-enriched, boron-containing compound. In a specific embodiment, the isotopically-enriched, boron-containing compound comprises isotopically-enriched $B_2F_4$.

A further aspect of the disclosure relates to a method of improving beam current in an ion implantation process, comprising flowing an isotopically-enriched, boron-containing compound of any suitable type as described hereinabove, and generating an ion beam from the compound. In such method, the isotopically-rich, boron-containing compound can comprise a compound having a chemical formula of $B_2F_4$. Such boron-containing compound upon ionization may form various ionic species and fragments, including one or more species from among $B_2F_4^+$, $B_2F_3^+$, $B_2F_2^+$, $BF_3^+$, $BF_2^+$, $BF^+$, $B^+$, $F^+$, $B_2F_4^{++}$, $B_2F_3^{++}$, $B_2F_2^{++}$, $BF_3^{++}$, $BF_2^{++}$, $BF^{++}$, $B^{++}$, $F^{++}$, $B_2F_4^{+++}$, $B_2F_3^{+++}$, $B_2F_2^{+++}$, $BF_3^{+++}$, $BF_2^{+++}$, $BF^{+++}$, $B^{+++}$, and $F^{+++}$.

Significant improvement can be achieved in beam current as a result of the use of isotopically-enriched boron-containing compounds, and their correspondingly enriched boron-containing ionic species and fragments, as selected for implantation, by a selector comprising an AMU magnet or other selector. In such various embodiments, the concentration of atomic mass 11 boron isotope in the boron-containing compound, and in ionic species and fragments therefrom, can be greater than 80.1%, 85%, 90%, 95%, 99%, 99.9% or 99.99%. Alternatively, boron-containing compounds enriched in atomic mass 10 boron isotope can be utilized, i.e., boron-containing compounds, and corresponding ionic species and fragments therefrom, in which the concentration of atomic mass 10 boron isotope is greater than 19.9%, 20%, 25%, 30%, 35%, 40%, 45%, 50%, 55%, 60%, 65%, 70%, 80%, 85%, 90%, 95%, 99%, 99.9% or 99.99%.

In addition to utilizing isotopically-enriched compounds as feed gas sources for ion implantation, the disclosure contemplates arrangements in which combinations of boron-containing source compounds are utilized, to achieve various improvments, e.g., improvement in beam current and/or other operating parameters of the ion implant operation, reduction in levels of decomposition and deposits therefrom, enhancement of resistance to clogging of flow passages in the ion implantation system, etc.

The disclosure further contemplates use of compounds that are homogenous in boron isotope as precursors for boron ion implantation, i.e., boron-containing compounds, and ionic species and fragments therefrom, wherein all atomic boron is $^{10}B$ or $^{11}B$, to achieve improvements in beam current or other operational parameters of the ion implantation operation and system.

Use of isotopically-enriched boron-containing compounds has been demonstrated to afford significant improvement in beam current for selected ionic species, e.g., beam current improvement levels of from 5 to 30% or more, depending on the particular ionic species being selected for ion implantation. The ionic species, isotopically enriched in boron content, can be of any suitable type, and can for example include one or more of $B_2F_4^+$, $B_2F_3^+$, $B_2F_2^+$, $BF_3^+$, $BF_2^+$, $BF^+$, $B^+$, $F^+$, $B_2F_4^{++}$, $B_2F_3^{++}$, $B_2F_2^{++}$, $BF_3^{++}$, $BF_2^{++}$, $BF^{++}$, $B^{++}$, $F^{++}$, $B_2F_4^{+++}$, $B_2F_3^{+++}$, $B_2F_2^{+++}$, $BF_3^{+++}$, $BF_2^{+++}$, $BF^{+++}$, $B^{+++}$, and $F^{+++}$. Thus, isotopic enrichment can be utilized to improve AMU magnet selection of ions of a desired type, such as for example $BF_2^+$, $BF^+$ or $F^+$. By increasing the beam current in the ion implant tool with such isotopically enriched species, it is possible to avoid the need for increasing the source gas flow and the source arc power, such as may otherwise be required to achieve higher beam current levels, but which are less efficient and result in low utilization of the source gas for ion implantation.

The use of isotopically-enriched $B_2F_4$ is particularly preferred, since such boron source compound even at natural abundance isotopic composition affords significant improvement in beam current as compared to beam currents obtained using boron trifluoride under the same conditions and in the same ion implant tool, e.g., for species such as $BF_2^+$ and $B^+$ Isotopic enrichment can further increase the magnitude of such improvements.

The disclosure in another aspect relates to generation of ion species in ionization of an isotopically-enriched boron-containing compound, as useful for ion implantation, in which the isotopically-enriched boron-containing ion species is selected from among $B_2F_4^+$, $B_2F_3^+$, $B_2F_2^+$, $BF_3^+$, $BF_2^+$, $BF^+$, $B^+$, $F^+$, $B_2F_4^{++}$, $B_2F_3^{++}$, $B_2F_2^{++}$, $BF_3^{++}$, $BF_2^{++}$, $BF^{++}$, $B^{++}$, $F^{++}$, $B_2F_4^{+++}$, $B_2F_3^{+++}$, $B_2F_2^{+++}$, $BF_3^{+++}$, $BF_2^{+++}$, $BF^{+++}$, $B^{+++}$, and $F^{+++}$. The disclosure further contemplates AMU magnet selection of one or more of such ion species generated from ionization of an isotopically-enriched boron-containing compound, and implantation of such isotopically-enriched boron-containing ion species in a substrate, such as a microelectronic device substrate.

The isotopically-enriched boron-containing species may be isotopically enriched to provide a concentration of atomic mass 11 boron isotope, or a concentration of atomic mass 10 boron isotope varied from natural abundance levels, at any of the concentrations previously described, i.e., concentration of atomic mass 11 boron isotope in the ionic species greater than 80.1%, 85%, 90%, 95%, 99%, 99.9% or 99.99%, or an isotopically-enriched boron containing species in which the concentration of mass 10 boron isotope is greater than 19.9%, 20%, 25%, 30%, 35%, 40%, 45%, 50%, 55%, 60%, 65%, 70%, 80%, 85%, 90%, 95%, 99%, 99.9% or 99.99%.

Another aspect of the present disclosure relates to a method of reducing thermal decomposition and deposition of material on surfaces of the ion implantation tool as a result of using isotopically-enriched boron-containing source compounds. Thermal decomposition of boron-containing source compounds used in ion implantation can result in deposition of elemental boron with production of boron trifluoride or other byproduct gas species. Even if the gas feed line is sufficiently cooled, some thermal deposition inevitably occurs on the arc chamber walls. The deposit formed as a result of such decomposition and associated deposition can be a mixture of boron metal deriving from the source gas, and tungsten or molybdenum from the arc chamber walls. Deposits can form in the gas feed lines near the ion source, as well as inside and on surfaces of nozzles, arc chamber base plates, and below base plate liners of the ionizer. Such deposits require periodic maintenance removal, such as by abrasive cleaning and chemical methods, e.g., flow through the tool containing deposits of a suitable cleaning gas, to volatilize the deposits so that they can be removed. The resulting effluent can be processed for remediation or recovery of specific materials from the effluent stream.

If the ion implanter is not dedicated to operation with only boron dopants, various types of solid materials or ions may be formed by interaction between the ions derived from the boron source compound and materials otherwise present in the vacuum chamber, depending on its materials of construction, such as the tungsten and molybdenum materials previously described. In a tungsten arc chamber with aluminum insulators, ions may be formed of widely varying type, including $WF_x^+$ wherein x=0, 1, 2, 3, 4, 5 or 6 and $AlF_y^+$ wherein y=0, 1, 2, or 3. Such ions can react with the isotopically-enriched boron-containing source compounds to form corresponding isotopically-enriched deposits. The isotopic character of such deposits may afford opportunity to utilize cleaning agents that are selective for same as a result of their isotopic composition.

A further aspect of the disclosure relates to a method of preparing a source of the isotopically enriched, boron-containing compound of any suitable type as described hereinabove, in which the method comprises filling a storage and dispensing vessel with the compound. In such method, the isotopically enriched, boron-containing compound in one embodiment has the chemical formula $B_2F_4$.

The isotopically-enriched, boron-containing compound of the present disclosure includes a wide variety of compounds, specific ones of which are in gas, solid or liquid forms at standard conditions (1 atm pressure, 25° C.).

Thus, the disclosure contemplates an ionized composition useful for AMU separation to generate ionic species for ion implantation, said composition deriving from a boron precursor compound other than $BF_3$, wherein said boron precursor compound is isotopically enriched beyond natural abundance in one of $^{10}B$ and $^{11}B$, and wherein said composition comprises one or more species from among $B_2F_4^+$, $B_2F_3^+$, $B_2F_2^+$, $BF_3^+$, $BF_2^+$, $BF^+$, $B^+$, $F^+$, $B_2F_4^{++}$, $B_2F_3^{++}$, $B_2F_2^{++}$, $BF_3^{++}$, $BF_2^{++}$, $BF^{++}$, $B^{++}$, $F^{++}$, $B_2F_4^{+++}$, $B_2F_3^{+++}$, $B_2F_2^{+++}$, $BF_3^{+++}$, $BF_2^{+++}$, $BF^{+++}$, $B^{+++}$, and $F^{+++}$, the boron-containing ones of which are isotopically enriched beyond natural abundance in one of $^{10}B$ and $^{11}B$.

In such composition, the boron precursor compound can have the chemical formula of $B_2F_4$ or any other suitable formula. The composition may be constituted so that concentration of atomic mass 10 boron isotope in the boron-containing ionic species is greater than 19.9%, 20%, 25%, 30%, 35%, 40%, 45%, 50%, 55%, 60%, 65%, 70%, 80%, 85%, 90%, 95%, 99%, 99.9%, or 99.99%. Alternatively, the composition may be constituted so that concentration of atomic mass 11 boron isotope in said boron-containing ionic species is greater than 80.1%, 85%, 90%, 95%, 99%, 99.9% or 99.99%.

A further aspect of the disclosure relates to a boron ionic species selected from among $B_2F_4^+$, $B_2F_3^+$, $B_2F_2^+$, $BF_3^+$, $BF_2^+$, $BF^+$, $B^+$, $B_2F_4^{++}$, $B_2F_3^{++}$, $B_2F_2^{++}$, $BF_3^{++}$, $BF_2^{++}$, $BF^{++}$, $B^{++}$, $B_2F_4^{+++}$, $B_2F_3^{+++}$, $B_2F_2^{+++}$, $BF_3^{+++}$, $BF_2^{+++}$, $BF^{+++}$ and $B^{+++}$, and isotopically enriched beyond natural abundance in one of $^{10}B$ and $^{11}B$. In the boron ionic species, the concentration of atomic mass 10 boron isotope in said boron ionic species is greater than 19.9%, 20%, 25%, 30%, 35%, 40%, 45%, 50%, 55%, 60%, 65%, 70%, 80%, 85%, 90%, 95%, 99%, 99.9%, or 99.99%, or alternatively, the concentration of atomic mass 11 boron isotope in said boron ionic species is greater than 80.1%, 85%, 90%, 95%, 99%, 99.9% or 99.99%.

A still further aspect of the disclosure relates to a method of improving beam current for an ion implantation process, comprising use of an isotopically-enriched, boron-containing compound that is effective to form isotopically enriched ionic species producing such improved beam current, in relation to a corresponding non-isotopically-enriched, boron-containing compound.

The isotopically-enriched, boron-containing compound may have the chemical formula of $B_2F_4$, or comprise any other suitable isotopically-enriched, boron-containing compound. In one embodiment, the concentration of atomic mass 10 boron isotope in the isotopically enriched ionic species is greater than 19.9%, 20%, 25%, 30%, 35%, 40%, 45%, 50%, 55%, 60%, 65%, 70%, 80%, 85%, 90%, 95%, 99%, 99.9%, or 99.99%. In another embodiment, the concentration of atomic mass 11 boron isotope in said isotopically enriched ionic species is greater than 80.1%, 85%, 90%, 95%, 99%, 99.9% or 99.99%.

A further aspect of the disclosure relates to use of diborane ($B_2H_6$) in combination with $B_2F_4$, as a dopant precursor composition. The $B_2F_4$ in such dopant precursor composition may be isotopically-enriched as variously described herein, or alternatively in a non-isotopically-enriched form. The diborane in such dopant precursor composition likewise may be isotopically enriched in boron isotopic species, or alternatively in a non-isotopically-enriched form. In the use of such dopant precursor composition of $B_2F_4$ and diborane, the $B_2F_4$ and diborane compounds can be premixed with one another and delivered from a same source package, or alternatively, each of such $B_2F_4$ and diborane compounds can be supplied from separate source packages, and flowed to the process tool from such separate source packages, in any suitable manner. For example, the respective $B_2F_4$ and diborane compounds can be co-flowed to the process tool from the separate source packages, or alternatively, such compounds may be delivered to the process tool in a sequential or alternating manner.

In another aspect of the disclosure, boron compounds and compositions of the present disclosure can be utilized for plasma doping of substrates for production of solar cells, using boron ions derived from enriched, or non-enriched, $B_2F_4$ and $B_2F_4$-containing compositions variously described herein.

Referring now to the drawing, FIG. 1 is a schematic illustration of a semiconductor manufacturing facility including an ion implantation system arranged to receive an isotopically-enriched boron-containing precursor from a precursor supply vessel, according to one embodiment of the present disclosure.

As shown in FIG. 1, the semiconductor manufacturing facility 180 includes a dopant precursor supply vessel 182, arranged to dispense dopant precursor to the ion source chamber of the ion implantation system. The dopant precursor supply vessel 182 may be of any suitable type, and may for example be constituted by an adsorbent-based fluid storage and dispensing apparatus of the type commercially available from ATMI, Inc. (Danbury, Conn., USA) under the trademark "SDS", arranged for supplying dopant precursor gas at sub-atmospheric pressure, e.g., a pressure below 600 torr, such as a pressure in a range of from about 10 to about 500 torr, when the dopant precursor is of gaseous form and physically adsorbable on the sorbent medium contained in the vessel. Alternatively, the dopant precursor may be of liquid form when stored in a pressurized state, e.g., in a pressure-regulated vessel of a type commercially available from ATMI, Inc. (Danbury, Conn., USA) under the trademark "VAC", arranged to dispense gas at lower pressure from the liquid-containing vessel. As a still further alternative, the dopant precursor may be of a solid form and may be provided in a vaporizer vessel of a type commercially available from ATMI, Inc. (Danbury, Conn., USA) under the trademark ProE-Vap, in which the dopant precursor solid is heated to generate precursor vapor for the ion implantation operation.

The dopant precursor in the illustrative FIG. 1 system can for example comprise isotopically-enriched diboron tetrafluoride ($B_2F_4$), or any other isotopically enriched boron-containing precursor.

The dopant gas is flowed in feed line 184 to gas delivery unit 186, which is constructed and arranged to suppress ionization of the dopant gas upstream of the high-voltage inlet 188 of ion source 190, in which the dopant gas is subjected to ionization to form dopant ions of the desired character.

The resulting dopant ions are transmitted in passage 192 from the ion source 190 to the implant chamber 194, in which a wafer (not shown) is disposed in ion impingement position in relation to the ion stream of the dopant species.

The byproduct effluent from the implant chamber is flowed in effluent treatment line 196 to effluent treatment unit 198, in which the effluent may be subjected to treatment and/or reclamation processing, to produce a final effluent that is discharged from the effluent treatment unit 198.

Boron precursors and precursor mixtures may be utilized in the broad practice of the present disclosure to manufacture a variety of product articles, assemblies, and subassemblies. For example, such products may include, without limitation: semiconductor product articles, assemblies, and subassemblies; flat panel display articles, assemblies, and subassemblies; and solar product articles, assemblies, and subassemblies. These products may include boron-doped materials and/or other boron-containing materials, compositions, components and structural elements. The flat panel display articles, assemblies, and subassemblies may include products such as displays including field emission arrays comprising patterned boron nanocones, boron-doped polycrystalline silicon germanium films for thin film transistor elements of active matrix flat panel displays, boron nitride nanotube structures for flat panel display applications, etc. he solar product articles, assemblies, and subassemblies may include solar photovoltaic panels, solar thermal apparatus, boron-implanted N-ype solar cells, multi-crystalline silicon solar cells including screenprinted boron back surface field (BSF) construction, etc.

The disclosure in a further aspect relates to a process system, comprising
a process tool;
a first boron precursor source configured to supply a first boron precursor to the process tool; and
a second boron precursor source configured to supply a second boron precursor to the process tool concurrently with the first boron precursor,
wherein the first boron precursor source comprises $B_2F_4$ and the second boron precursor source comprises diborane.

The process tool in the foregoing process system can be of any suitable type, and for example can comprise an ion implantation apparatus, a vapor deposition apparatus, a reaction chamber, or other process tool. In one embodiment, the process tool can comprise a boron doping ion implantation apparatus disposed in a manufacturing facility configured to produce product articles, assemblies, or subassemblies, comprising boron doped material. Such manufacturing facility can be configured for specific production, e.g., configured to produce semiconductor product articles, assemblies, or subassemblies, comprising doped boron material. Alternatively, the manufacturing facility can be configured to produce solar energy product articles, assemblies, or subassemblies, comprising boron doped material. As a still further alternative, the manufacturing facility can be configured to produce flat panel display product articles, assemblies, or subassemblies, comprising boron doped material.

The process system can be configured in various embodiments so that the first boron precursor and second boron precursor are co-flowed to the process tool.

In one implementation of the foregoing process system, the process system comprises a co-flow feed line for introducing co-flowed first and second boron precursors to the process tool, where each of the first boron precursor source and second boron precursor source comprises a precursor supply vessel coupled in flow communication to the co-flow feed line.

The foregoing process system can be constituted, wherein at least one of the $B_2F_4$ and diborane boron precursor sources is isotopically enriched. Thus, process system implementations are contemplated in which only $B_2F_4$ is enriched, or in which only diborane is isotopically enriched, or in which both $B_2F_4$ and diborane are isotopically enriched.

A further aspect of the disclosure relates to an ion implantation process, comprising: co-flowing $B_2F_4$ and diborane to an ionizing zone; ionizing the co-flowed $B_2F_4$ and diborane in the ionizing zone to form boron dopant species; and ion implanting the boron dopant species.

Such process may be conducted in various modes of operation, wherein at least one of the $B_2F_4$ and diborane boron precursor sources is isotopically enriched. The process may be conducted with only $B_2F_4$ being enriched, or with only diborane being isotopically enriched, or with both $B_2F_4$ and diborane being isotopically enriched.

The foregoing process can be conducted, with the ionizing being carried out so as to generate an ion beam of the boron dopant species, and the ion beam of the boron dopant species being accelerated by electric field to implant boron-containing ions in a substrate.

As discussed herein above, the ion implantation processes of the present disclosure can be carried out in a method of manufacturing a product article, assembly, or subassembly, comprising boron-doped material. For example, the product article, assembly, or subassembly can comprise a semiconductor product article, assembly, or subassembly. Alternatively, the product article, assembly, or subassembly can comprise a solar energy product article, assembly, or subassembly. As a still further alternative, the product article, assembly, or subassembly can comprise a flat panel display product article, assembly, or subassembly.

Figure 2:
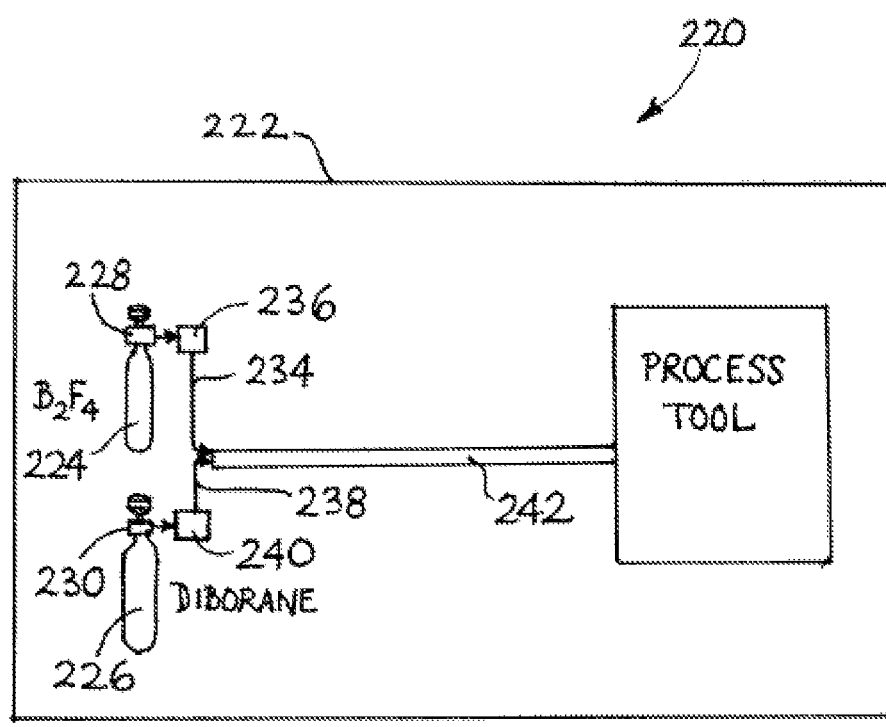
FIG. 2 is a schematic representation of a manufacturing process system including a manufacturing facility containing a process tool (PROCESS TOOL) arranged to be supplied with boron precursor through a boron precursor co-flow feed line.

FIG. 2 is a schematic representation of a manufacturing process system 220 including a manufacturing facility 222 containing a process tool (PROCESS TOOL) arranged to be supplied with boron precursor through a boron precursor co-flow feed line 242.

First boron precursor source comprises vessel 224 containing $B_2F_4$ and equipped with a valve head assembly 228 coupled with a $B_2F_4$ supply line 234 containing flow controller 236 therein. The valve head assembly may be constructed with a manual handwheel as illustrated or the valve head assembly may be coupled with an automatic valve actuator couple operatively with a central processor unit (CPU) for automatic operation of the valve in the valve head assembly. The flow controller 236 can be of any suitable type, including for example mass flow controllers, regulators, restricted flow orifice (RFO) devices, flow control valves, or any other components that are effective to modulate the flow of the precursor from the vessel 224. The $B_2F_4$ supply line 234 is arranged to flow $B_2F_4$ to the boron precursor co-flow feed line 242.

The vessel itself may be of any suitable type, and can for example comprise a vessel containing a storage medium, such as a physical adsorbent or ionic liquid storage medium, on and/or in which the boron precursor is stored. Sorbent-based vessels useful for such purpose are commercially available from ATMI, Inc. (Danbury, Conn., USA) under the trademark SDS. Alteratively, the vessel may be of an internally pressure-regulated type, including a pressure regulator arrangement disposed in the interior volume of the vessel; vessels of such type are commercially available from ATMI, Inc. (Danbury, Conn., USA) under the trademark VAC.

Second boron precursor source comprises vessel 226 containing diborane and equipped with a valve head assembly 230 coupled with a diborane supply line 238 containing flow controller 240 therein. The valve head assembly may be constructed with a manual handwheel as illustrated or the valve head assembly may be coupled with an automatic valve actuator couple operatively with a central processor unit (CPU) for automatic operation of the valve in the valve head assembly. The flow controller 240, in like manner to flow controller 236 associated with vessel 224, can be of any suitable type, including for example mass flow controllers, regulators, restricted flow orifice (RFO) devices, flow control valves, or any other components that are effective to modulate the flow of the precursor from the vessel 226. The diborane supply line 238 is arranged to flow diborane to the boron precursor co-flow feed line 242.

The process tool in such system can comprise an ion implantation process tool, in which the co-flowed boron precursor mixture comprising $B_2F_4$ and diborane is flowed to an ion source chamber for ionization to form boron ions for implantation, e.g., in a semiconductor substrate.

In the above-described process system and process implementations wherein $B_2F_4$ and diborane are co-flowed to the process tool, e.g., an ionization chamber or other tool or process zone, the relative proportions of the respective $B_2F_4$ and diborane components in the co-flowed mixture can be varied, as necessary or desirable in a given application. For example, the amount of $B_2F_4$ in the $B_2F_4$ and diborane co-flow mixture can range from 1% to 99% by volume, based on total volume of $B_2F_4$ and diborane co-flow mixture, with diborane in the $B_2F_4$ and diborane co-flow mixture correspondingly ranging from 99% to 1% by volume, on the same total volume basis. In specific embodiments, the amount of $B_2F_4$ in the $B_2F_4$ and diborane co-flow mixture can be 1%, 2%, 3%, 4%, 5%, 7%, 9%, 10%, 12%, 15%, 20%, 25%, 30%, 35%, 40%, 45%, 50%, 55%, 60%, 65%, 70%, 75%, 80%, 85%, 90%, 95%, 97%, 98%, or 99%, by volume, based on total volume of the $B_2F_4$ and diborane co-flow mixture, with the corresponding amount of diborane being 99%, 98%, 97%, 96%, 95%, 93%, 91%, 90%, 88%, 85%, 80%, 75%, 70%, 65%, 60%, if 5%, 50%, 45%, 40%, 35%, 30%, 25%, 20%, 50%, 10%, 5%, 3%, 2%, or 1%, respectively.

Boron precursor mixtures comprising $B_2F_4$ and diborane can be utilized in accordance with the present disclosure in ion implantation applications to generate ionic species and fragments for boron ion implantation. In such applications, the bicomponent precursor mixtures can be utilized with significant benefits over single boron precursor operation, including enhanced beam currents, increased ion source life, and lowered cost of ownership for the ion implantation apparatus.

The invention, as variously described herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the invention. The invention is described herein in various embodiments, and with reference to various features and aspects of the invention. The invention contemplates such features, aspects and embodiments in various permutations and combinations, as being within the scope of the invention. The invention may therefore be specified as comprising, consisting or consisting essentially of, any of such combinations and permutations of these specific features, aspects and embodiments, or a selected one or ones thereof.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A process system, comprising:
   a process tool;
   a first boron precursor source configured to supply a first boron precursor to the process tool; and
   a second boron precursor source configured to supply a second boron precursor to the process tool concurrently with the first boron precursor,
   wherein the first boron precursor source comprises $B_2F_4$ and the second boron precursor source comprises diborane.

2. The process system of claim 1, wherein the process tool comprises an ion implantation apparatus.

3. The process system of claim 1, comprising a co-flow feed line for introducing co-flowed first and second boron precursors to the process tool, where each of the first boron precursor source and second boron precursor source comprises a precursor supply vessel coupled in flow communication to the co-flow feed line.

4. The process system of claim 1, wherein the process tool comprises a boron doping ion implantation apparatus disposed in a manufacturing facility configured to produce product articles, assemblies, or subassemblies, comprising boron doped material.

5. The process system of claim 4, wherein the manufacturing facility is configured to produce semiconductor product articles, assemblies, or subassemblies, comprising doped boron material.

6. The process system of claim 4, wherein the manufacturing facility is configured to produce solar energy product articles, assemblies, or subassemblies, comprising boron doped material.

7. The process system of claim 4, wherein the manufacturing facility is configured to produce flat panel display product articles, assemblies, or subassemblies, comprising boron doped material.

8. The process system of claim 1, wherein at least one of said $B_2F_4$ and diborane is isotopically enriched.

9. The process system of claim 1, wherein said $B_2F_4$ is isotopically enriched.

10. The process system of claim 1, wherein said diborane is isotopically enriched.

11. The process system of claim 1, wherein both of said $B_2F_4$ and diborane are isotopically enriched.

* * * * *